US010991668B1

(12) United States Patent
Koga et al.

(10) Patent No.: US 10,991,668 B1
(45) Date of Patent: Apr. 27, 2021

(54) CONNECTION PAD CONFIGURATION OF SEMICONDUCTOR DEVICE

(71) Applicant: SYNAPTICS INCORPORATED, San Jose, CA (US)

(72) Inventors: Tsuyoshi Koga, Tokyo (JP); Shinya Suzuki, Tokyo (JP); Naoki Hasegawa, Tokyo (JP); Naoyuki Narita, Tokyo (JP); Kiyotaka Miwa, Tokyo (JP); Kazuhiko Sato, Tokyo (JP); Yuichi Nakagomi, Tokyo (JP)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 16/720,876

(22) Filed: Dec. 19, 2019

(51) Int. Cl.
*H01L 23/00* (2006.01)
*H01L 23/31* (2006.01)

(52) U.S. Cl.
CPC .......... *H01L 24/13* (2013.01); *H01L 23/3128* (2013.01); *H01L 24/05* (2013.01)

(58) Field of Classification Search
CPC ...................................................... H01L 24/13
See application file for complete search history.

(56) References Cited

U.S. PATENT DOCUMENTS

| 5,962,921 | A  | * | 10/1999 | Farnworth | G01R 1/0408 |
| | | | | | 257/739 |
| 6,194,781 | B1 | * | 2/2001 | Ikegami | H01L 24/16 |
| | | | | | 257/737 |
| 7,102,223 | B1 | * | 9/2006 | Kanaoka | H01L 23/522 |
| | | | | | 257/700 |
| 7,663,201 | B2 | * | 2/2010 | Yamada | H01L 24/05 |
| | | | | | 257/459 |
| 8,076,786 | B2 | * | 12/2011 | Hung | H01L 24/48 |
| | | | | | 257/786 |
| 8,409,979 | B2 | * | 4/2013 | Choi | H01L 24/11 |
| | | | | | 438/613 |
| 8,766,441 | B2 | * | 7/2014 | Chang | H01L 24/03 |
| | | | | | 257/739 |
| 8,952,529 | B2 | * | 2/2015 | Lee | H01L 23/3128 |
| | | | | | 257/737 |
| 9,406,629 | B2 | * | 8/2016 | Tseng | H01L 24/02 |
| 9,607,963 | B2 | * | 3/2017 | Lin | H01L 24/16 |
| 9,685,402 | B2 | * | 6/2017 | Chen | H01L 24/14 |
| 9,871,013 | B2 | * | 1/2018 | Tsai | H01L 23/49811 |
| 10,141,275 | B2 | * | 11/2018 | Lin | H01L 24/02 |
| 10,433,421 | B2 | * | 10/2019 | Zhang | H05K 1/113 |
| 2002/0039801 | A1 | * | 4/2002 | Ishii | H01L 24/03 |
| | | | | | 438/14 |
| 2004/0070079 | A1 | * | 4/2004 | Huang | H01L 24/13 |
| | | | | | 257/778 |
| 2006/0237855 | A1 | * | 10/2006 | Kroehnert | H01L 23/49811 |
| | | | | | 257/779 |
| 2010/0252926 | A1 | * | 10/2010 | Kato | H01L 24/13 |
| | | | | | 257/738 |
| 2011/0186989 | A1 | * | 8/2011 | Hsiao | H01L 21/44 |
| | | | | | 257/737 |

(Continued)

*Primary Examiner* — William A Harriston
(74) *Attorney, Agent, or Firm* — Leydig, Voit & Mayer, Ltd.

(57) ABSTRACT

A semiconductor device comprises a semiconductor substrate, a connection pad, and a bump. The connection pad is connected to the bump and disposed between the semiconductor substrate and the bump. The connection pad has one or more slits.

19 Claims, 12 Drawing Sheets

(56) References Cited

U.S. PATENT DOCUMENTS

| | | | |
|---|---|---|---|
| 2014/0252610 A1* | 9/2014 | Chen | H01L 24/09 |
| | | | 257/738 |
| 2015/0014848 A1* | 1/2015 | Lin | H01L 21/4846 |
| | | | 257/737 |
| 2018/0040575 A1* | 2/2018 | Lin | H01L 24/02 |

* cited by examiner

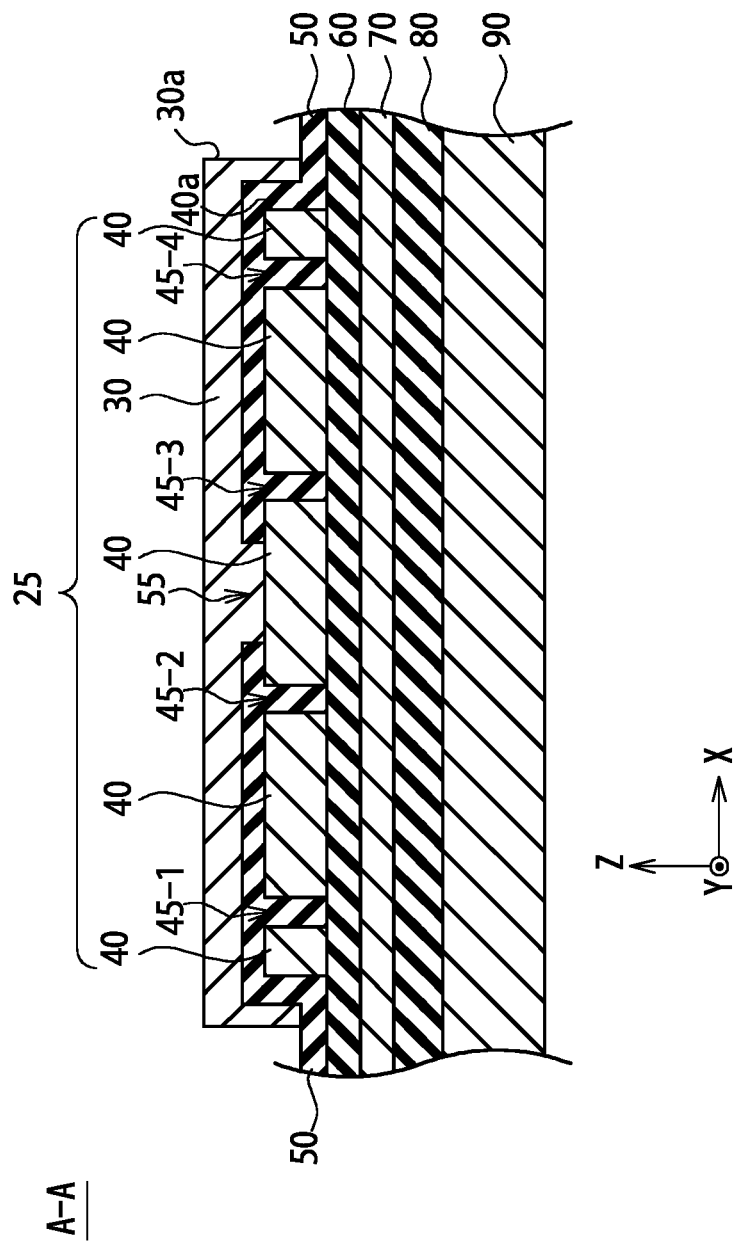

CONNECTION PAD CONFIGURATION OF SEMICONDUCTOR DEVICE

BACKGROUND

Field

Embodiments disclosed herein generally relate to connection pad configurations of semiconductor devices.

Description of the Related Art

A semiconductor device connected to a display panel may comprise one or more external connection terminals to receive and transmit various signals from and to an external device. An external connection terminal may comprise a connection pad and a bump.

SUMMARY

In one or more embodiments, a semiconductor device comprises a semiconductor substrate, a bump, and a connection pad. The connection pad is connected to the bump and disposed between the semiconductor substrate and the bump. The connection pad has one or more slits.

In one or more embodiments, a semiconductor device comprises a semiconductor substrate, a bump, and a connection pad. The connection pad is disposed between the semiconductor substrate and the bump. The connection pad comprises a wide portion and a narrow portion. The wide portion has a first width, and a narrow portion has a second width narrower than the first width of the wide portion. The wide portion is connected to the bump.

In one or more embodiments, a method comprises: preparing a semiconductor substrate; forming a bump; forming a connection pad connected to the bump between the semiconductor substrate and the bump. Forming the connection pad comprises forming a slit.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

FIG. 3A is a section view illustrating an example configuration of an external connection terminal, according to one or more embodiments.

Figure 1:
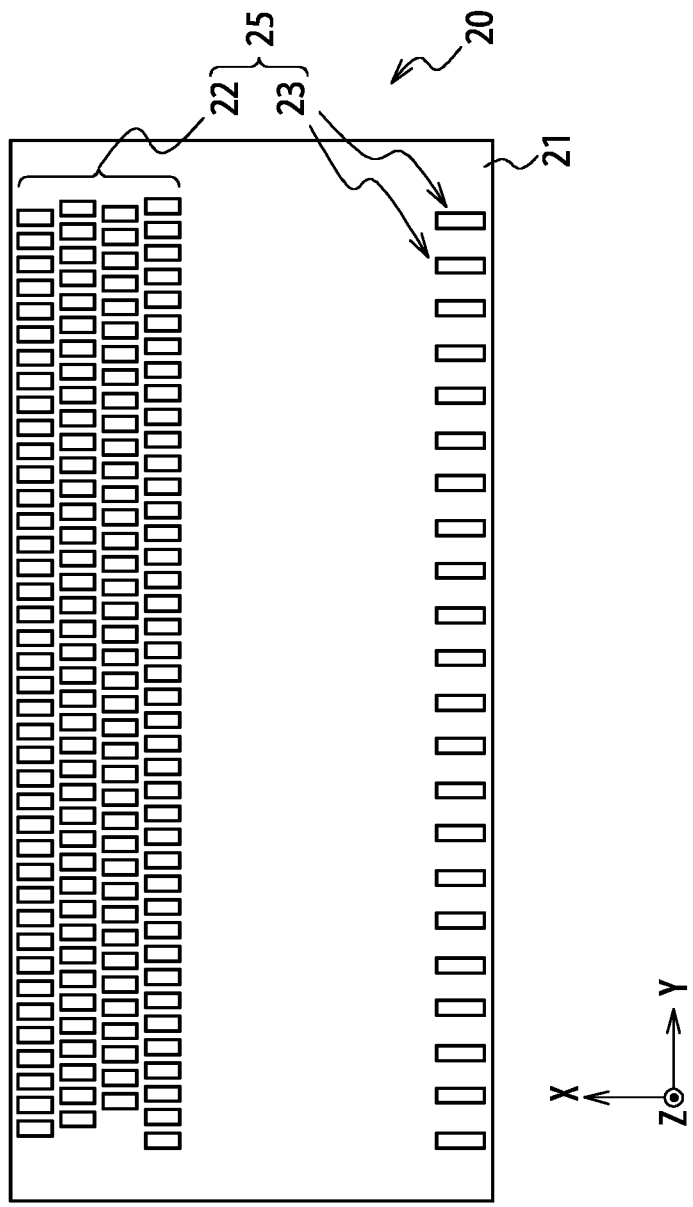
FIG. 1 is a plan view illustrating an example configuration of a semiconductor device, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

In one or more embodiments, a semiconductor device may be bonded to a substrate through a surface mount technology, such as a chip-on-glass (COG) technology. Examples of the substrate may comprise a glass substrate of a display panel, and a substrate of a printed circuit board. A semiconductor device adapted to a surface mount technology may comprise a bump connected to a connection pad. An assembly process to bond the semiconductor device to a substrate may cause a stress on the bump, and this may cause peeling of the bump. Accordingly, there is a technical need for suppressing or avoiding peeling of a bump.

In one or more embodiments, a connection pad has a slit. This slit may reduce an internal stress generated in the connection pad, suppressing or avoiding peeling of a bump.

In one or more embodiments, as illustrated in FIG. 1, the semiconductor device 20 comprises one or more external connection terminals 25 on an upper surface 21. Note that a Cartesian coordinate system is defined to indicate directions in FIG. 1 and other figures. The external connection terminals 25 may comprise output terminals 22 and input terminals 23. The output terminals 22 may be used to externally output signals from the semiconductor device 20, and the input terminals 23 may be used to receive signals from an external device.

Figure 2:
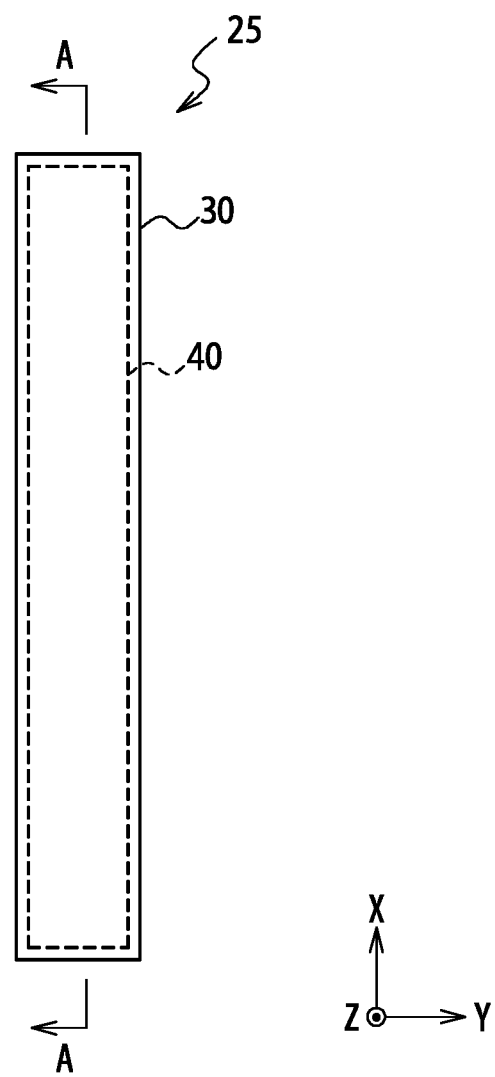
FIG. 2 is a plan view illustrating an example configuration of an external connection terminal, according to one or more embodiments.

In one or more embodiments, as illustrated in FIG. 2, each external connection terminal 25 comprises a bump 30 and a connection pad 40. In various embodiments, the bump 30 and the connection pad 40 are elongated in the X-axis direction. In such embodiments, the longitudinal direction of the connection pad 40 is the X-axis direction. The bump 30 may be disposed above the connection pad 40, and overlap at least a portion of the connection pad 40. In some embodiments, the bump 30 may cover the entirety of the connection pad 40. Bump 30 may be formed from gold, aluminum, copper, or any suitable electrically conductive material. Bump 30 may be formed from deformable conductive material to facilitate bonding of the semiconductor device 20 onto a display panel. Bump 30 may be of the same or different material than the connection pad 40. For example, bump 30 may be formed of gold, and the connection pad 40 may be formed of aluminum. Further, bump 30 may be formed through any suitable technique, such as electroplating, screen-printing, and the like.

As illustrated in FIG. 3A, the external connection terminal 25 may be formed above a semiconductor substrate 90. The semiconductor substrate 90 may comprise a silicon substrate. Alternatively, the semiconductor substrate 90 may comprise other materials. In various embodiments, an interlayer dielectric 80, an interconnection layer 70, and an interlayer dielectric 60 are sequentially stacked on the semiconductor substrate 90. The connection pad 40 may be disposed on the interlayer dielectric 60. The connection pad 40 may be connected to a circuit element via an interconnection disposed in the interconnection layer 70. In one or more embodiments, the connection pad 40 may be covered with a passivation layer 50. In various embodiments, an opening 55 is formed through the passivation layer 50, and the bump 30 is connected to the connection pad 40 through the opening 55. This provides an electrical connection between the bump 30 and the connection pad 40.

In one or more embodiments, the bump 30 protrudes beyond an edge of the connection pad 40. In FIG. 3A, the bump 30 is illustrated as protruding beyond an edge 40a of the connection pad 40 in the X-axis direction. In other embodiments, the bump 30 may be formed within the edges of the connection pad 40.

In one or more embodiments, the connection pad 40 has one or more slits 45. In FIG. 3A, four slits 45-1 to 45-4 are illustrated. The slits 45 may penetrate the connection pad 40 in the thickness direction. In one embodiment, the slits 45 penetrate the entirety of the connection pad 40. Alternatively, in other embodiments, the slits 45 penetrate a portion of the connection pad. Further, in one or more embodiments, a first slit 45 penetrates a first amount of the connection pad 40 and a second slit penetrates a second amount of the connection pad 40. The first amount differs from the second amount. The slits 45 may relieve an internal stress of the connection pad 40, suppressing or avoiding peeling of the bump 30 and/or the connection pad 40 in the manufacture process.

Figure 3B:
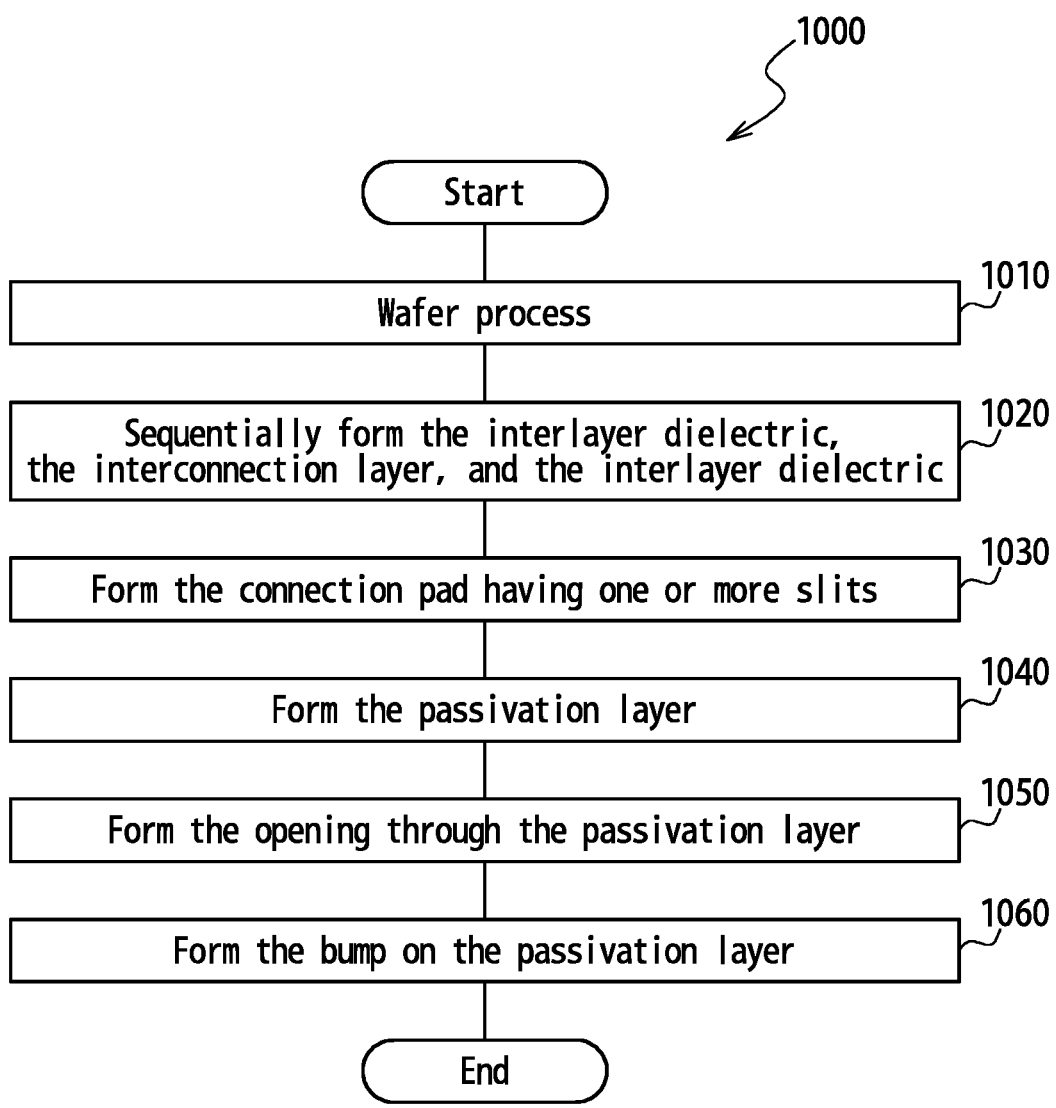
FIG. 3B illustrates an example manufacture process of a semiconductor device, according to one or more embodiments.

FIG. 3B illustrates an example manufacture process 1000 of the semiconductor device 20, according to one or more embodiments. In one or more embodiments, at step 1010, the semiconductor substrate 90 goes through a wafer process to form circuit elements such as transistors. At step 1020, the interlayer dielectric 80, the interconnection layer 70, and the interlayer dielectric 60 are sequentially formed on the semiconductor substrate 90, in one or more embodiments. The interconnection layer 70 may comprise one or more interconnections formed from aluminum or copper. At step 1030, the connection pad 40 is formed on the interlayer dielectric 60, in one or more embodiments. The connection pad 40 may be patterned to have one or more slits 45, for example, through a photolithography technique. At step 1040, the passivation layer 50 is formed to cover the connection pads 40 and interlayer dielectric 60, in one or more embodiments. In various embodiments, the opening 55 is then formed through the passivation layer 50 to reach the connection pad 40 at step 1050. At step 1060, the bump 30 is formed on the passivation layer 50 so that the bump 30 is connected to the connection pad 40 through the opening 55, in one or more embodiments. The bump 30 may be formed through photolithography and electroplating techniques.

Figure 4:
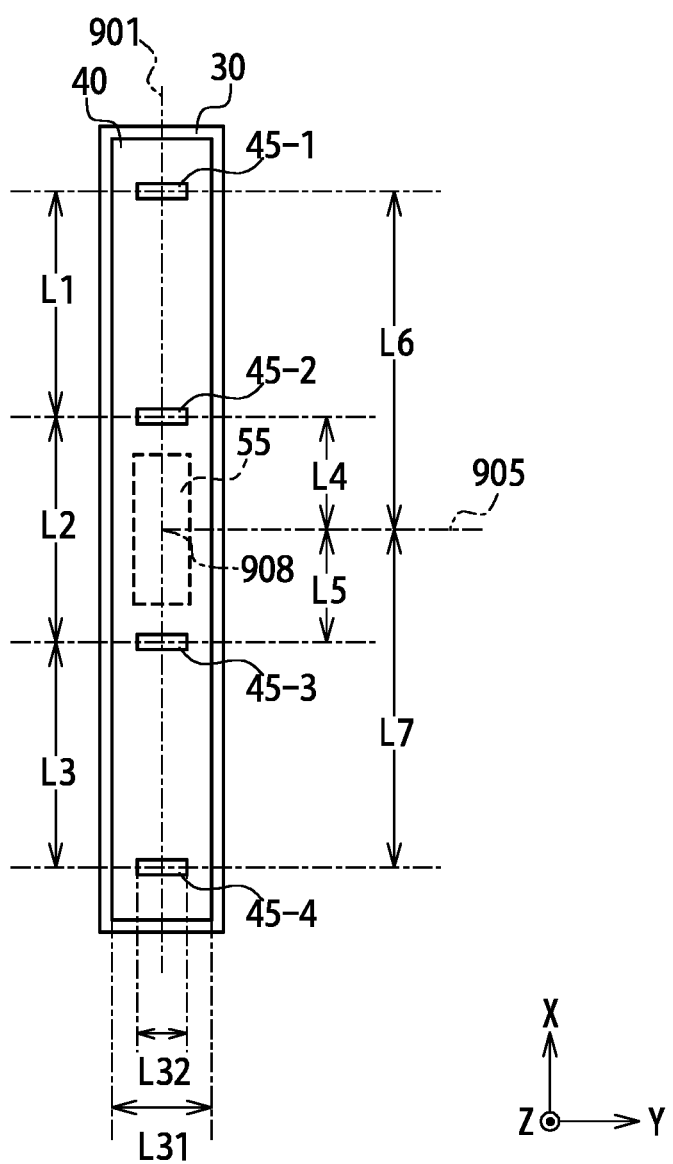
FIG. 4 is a plan view illustrating an example configuration of an external connection terminal, according to one or more embodiments.

In one or more embodiments, as illustrated in FIG. 4, the slits 45 are extended in the Y-axis direction, which is orthogonal to the longitudinal direction of the connection pad 40 (e.g., the direction along the X-axis). The slits 45 thus arranged may reduce an internal stress generated in the connection pad 40 in the longitudinal direction thereof, effectively suppressing or avoiding the peeling of the bump 30 and/or the connection pad 40.

In FIG. 4, the connection pad 40 is illustrated as having four slits 45-1 to 45-4. The slits 45-1 to 45-4 may be arrayed in the X-axis direction. The geometric centers of the slits 45 may be aligned on the center line 901. Alternatively, the geometric center of a first one or more of the slits 45 may be aligned with the center line 901 and the geometric center of a second one or more of the slits 45 may be unaligned with the center line 901. In one or more embodiments, the slits 45 may be spaced at equal intervals. For example, the distance L1 between the slits 45-1 and 45-2 may be equal to the distance L2 between the slits 45-2 and 45-3, and the distance L2 may be equal to the distance L3 between the slits 45-3 and 45-4. Alternatively, in one or more embodiments, the slits 45 may be spaced at unequal intervals.

In one or more embodiments, the opening 55 may be positioned at the center 908 of the connection pad 40. The center 908 may be the geometric center of the connection pad 40. The center 908 may be positioned at an intersection of center lines 901 and 905 of the connection pad 40, where the center line 901 may be defined in the X-axis direction and the center line 905 may be defined in the Y-axis direction, which is orthogonal to the X-axis direction. The opening 55 may be centered about the center lines 901 and 905 or the center of the opening 55 may be unaligned with one or more of the center lines 901 and 905.

In one or more embodiments, one or more of the slits 45 are positioned in the +X direction with respect to the opening 55, while different one or more of the slits 45 are positioned in the −X direction with respect to the opening 55, where the −X direction is opposite to the +X direction. In one or more embodiments, the slits 45-1 and 45-2 may be positioned in the +X direction with respect to the opening 55, and the slits 45-3 and 45-4 may be positioned in the −X direction with respect to the opening 55. The number of slits 45 positioned in the +X direction with respect to the opening 55 may be equal to the number of slits 45 positioned in the −X direction with respect to the opening 55. Alternatively, the number of slits 45 positioned in the +X direction with respect to the opening 55 may be less than or greater to the number of slits 45 positioned in the −X direction with respect to the opening 55

In one or more embodiments, the distance between one of the slits 45 and the center 908 of the connection pad 40 may be equal to the distance between another of the slits 45 and the center 908. For example, the distance L4 between the slit 45-2 and the center 908 may be equal to the distance L5 between the slit 45-3 and the center 908, and the distance L6 between the slit 45-1 and the center 908 may be equal to the distance L7 between the slit 45-4 to the center 908. Alternatively, in one or more embodiments, the distance between one of the slits 45 and the center 908 of the connection pad 40 may be less than or greater than the distance between another of the slits 45 and the center 908.

In one or more embodiments, the slits 45 may be arranged symmetrically. The slits 45 may be arranged in a line-symmetrical manner to the center line 905. The plurality of slits 45 may be arranged in a point-symmetric manner to the center 908 of the connection pad 40. In one or more embodiments, the slits 45-1 and 45-4 may be point-symmetric to the center 908, and the slits 45-2 and 45-3 may be point-symmetric to the center 908. Alternatively, in other embodiments, the slits 45 may be arranged non-symmetrically.

The lengths of the slits 45 may be based on the width of the connection pad 40 in the Y-axis direction. The lengths L32 of the slits 45 may be longer than one-third of the width L31 of the connection pad 40 in the Y-axis direction.

Figure 5:
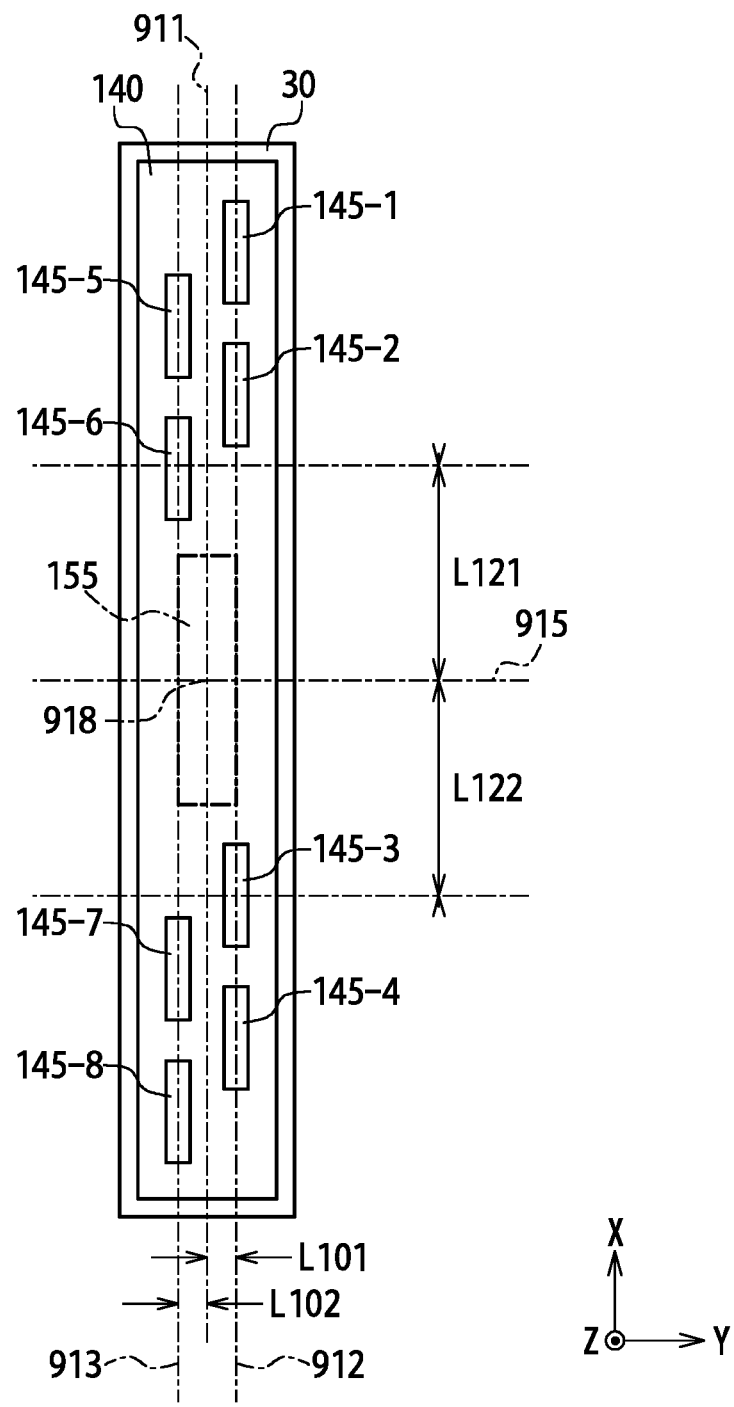
FIG. 5 is a plan view illustrating an example configuration of an external connection terminal, according to one or more embodiments.

The arrangement of the slits 45 may be variously modified, not limited to that illustrated in FIG. 4. In one or more embodiments, as illustrated in FIG. 5, a connection pad 140 has a plurality of slits 145, for example, eight slits 145-1 to 145-8. Alternatively, the plurality of slits 145 may include more then or less than eight slits. In one or more embodiments, the plurality of slits 145 are each extended in the X-axis direction. This may reduce an internal stress generated in the connection pad 140, suppressing or avoiding peeling of the bump 30 and/or the connection pad 140. The lengths of the plurality of slits 145 may be equal to each other. Alternatively, one or more of the lengths of the slits 145 may be greater than or less than the length of another one or more of the slits 145.

The slits 145 may be arrayed in the X-axis direction in one or more columns. In some embodiments, the geometric center of each slit 145 may be positioned on one of straight lines 912 and 913 both extending in the X-axis direction. In other embodiments, the geometric center of one or more of the slits 145 may be unaligned with either of the straight lines 912 and 913. In such embodiments, the geometric center of one or more of the slits 145 is not positioned on one of the straight lines 912 and 913. The distance L101 between the straight line 912 and the center 918 of the connection pad 140 may be equal to the distance L102 between the straight line 913 and the center 918. Alternatively, the distance L101 of the straight line 912 and the center 918 of the connection pad 140 may be less than or greater than the distance L102. The center 918 may be the geometric center of the connection pad 140. The center 918 may be positioned at an intersection of center lines 911 and 915 of the connection pad 140, where the center line 911 may be defined in the X-axis direction and the center line 915 may be defined in the Y-axis direction.

The geometric centers of the slits 145-1 to 145-4 may be positioned on the straight line 912, while the geometric centers of the slits 145-5 to 145-8 may be positioned on the straight line 913. The slits 145-5 to 145-8 may be shifted in the X-axis direction with respect to the slits 145-1 to 145-4. In one or more embodiments, the geometric center of one of the slits 145-1 to 145-4 may be unaligned with the center line 912 and one of the geometric centers of the slits 145-5-145-8 may be unaligned with the straight line 913.

In one or more embodiments, an opening 155 through which the bump 30 is connected to the connection pad 140 is disposed at the center 918 of the connection pad 140. The opening 155 may be elongated in the X-axis direction. The opening 155 may be rectangular. Alternatively, the opening 155 may be a square such that the opening 155 is not elongated in the X-axis direction or the Y-axis direction.

In one or more embodiments, at least one slit 145 is positioned in the +X direction with respect to the opening 155 and at least one different slit 145 is positioned in the −X direction with respect to the opening 155. For example, the slits 145-1, 145-2, 145-5, and 145-6 may be positioned in the +X direction with respect to the opening 155, while the slits 145-3, 145-4, 145-7, and 145-8 may be positioned in the −X direction with respect to the opening 155. In various embodiments, the number of slits 145 positioned in the +X direction with respect to the opening 155 maybe more than, less than, or equal to the number of slits positioned in the −X direction with respect to the opening 155.

In one or more embodiments, the distance between one of the slits 145 and the center 918 of the connection pad 140 may be equal to the distance between another of the slits 145 and the center 918. Alternatively, in some embodiments, the distance between each of the slits and the center 918 of the connection pad 140 may differ. In some embodiments, the slit 145-6 is closest to the center 918 of the connection pad 140 among the slits 145 positioned in the +X direction with respect to the center 918, and the slit 145-3 is closest to the center 918 among the slits 145 positioned in the −X direction with respect to the center 918. In such embodiments, the distance L121 between the geometric center of the slit 145-6 and the center 918 in the X-axis direction may be equal to the distance L122 between the geometric center of the slit 145-3 and the center 918 in the X-axis direction.

In one or more embodiments, the plurality of slits 145 may be arranged in a point-symmetrical manner to the center 918 of the connection pad 140. For example, the slits 145-1 and 145-8 may be arranged in a point-symmetrical manner to the center 918, and the slits 145-2 and 145-7 may be arranged in a point-symmetrical manner to the center 918. Similarly, the slits 145-3 and 145-6 may be arranged in a point-symmetrical manner to the center 918, and the slits 145-4 and 145-5 may be arranged in a point-symmetrical manner to the center 918.

Figure 6:
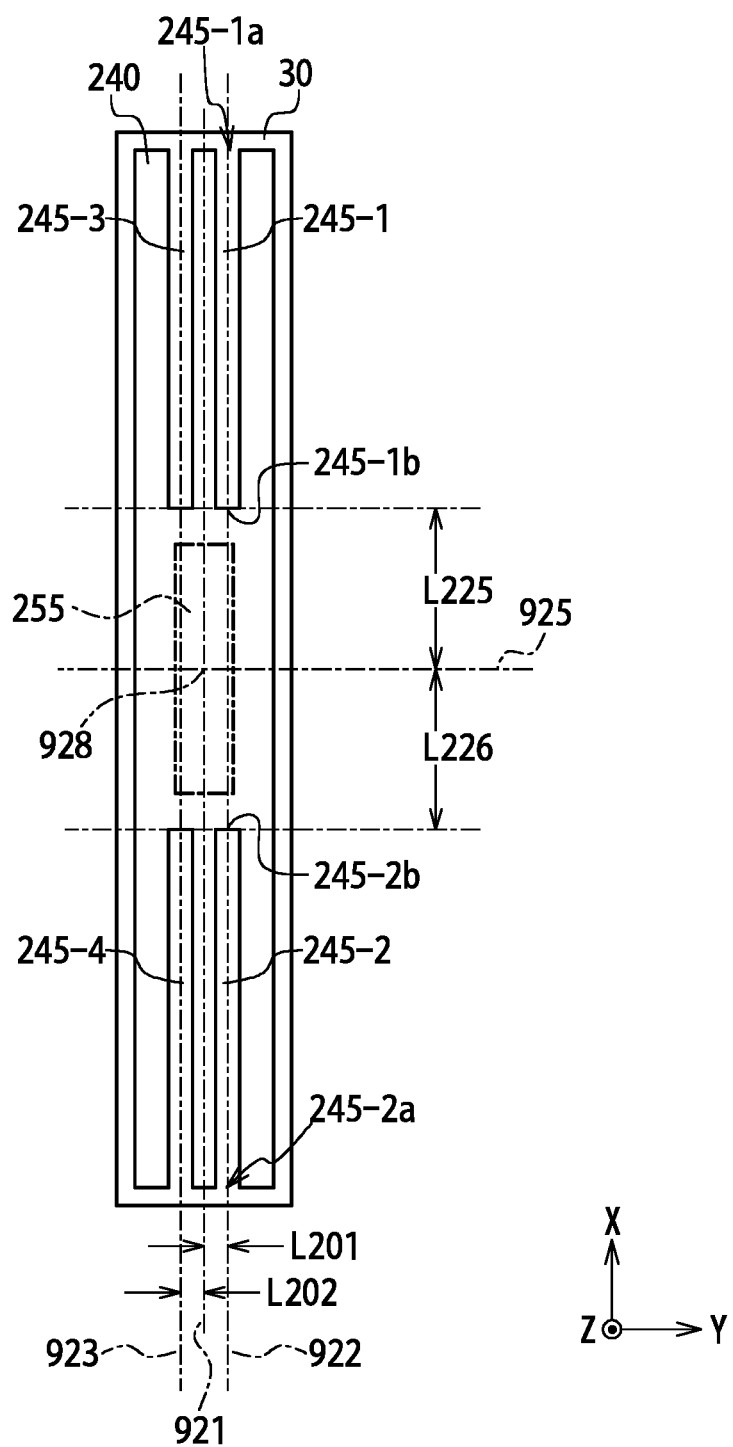
FIG. 6 is a plan view illustrating an example configuration of an external connection terminal, according to one or more embodiments.

In one or more embodiments, as illustrated in FIG. 6, a connection pad 240 may have a plurality of slits 245 each extended in the X-axis direction. In FIG. 6, the connection pad 240 is illustrated as having four slits 245-1 to 245-4. However, in other embodiments, the connection pad 240 may be have less than four slits or more than four slits. The slits 245 may be arrayed in two or more columns in the X-axis direction.

In one or more embodiments, at least one slit 245 has an open end and a closed end. In various embodiments, at least one of the slits 245 has two closed ends. For example, the slit 245-1 may have an open end 245-1*a* in the +X direction and a closed end 245-1*b* in the −X direction, and the slit 245-2 may have an open end 245-2*a* in the −X direction and a closed end 245-2*b* in the +X direction.

The geometric center of each slit 245 may be positioned on one of straight lines 922 and 923 both extending in the X-axis direction. Alternatively, the geometric center of the slit 245-1 may be unaligned with the geometric center of the slit 245-2 and/or the geometric center of the slit 245-3 may be unaligned with the geometric center of the slit 245-4. Further, the distance L201 between the straight line 922 and the center 928 of the connection pad 240 may be equal to the distance L202 between the straight line 923 and the center 928. Alternatively, the distance L201 between the straight line 922 and the center 928 of the connection pad 240 may be less than or equal to the distance L202 between the straight line 923 and the center 928. The center 928 may be the geometric center of the connection pad 240. The center 928 may be positioned at an intersection of center lines 921 and 925 of the connection pad 240, where the center line 921 may be defined in the X-axis direction and the center line 925 may be defined in the Y-axis direction. In one or more embodiments, the geometric centers of the slits 245-1 and 245-2 are positioned on the straight line 922, and the geometric centers of the slits 245-3 and 245-4 are positioned on the straight line 923.

In one or more embodiments, an opening 255 through which the bump 30 is connected to the connection pad 240 is disposed at the center 928 of the connection pad 240. The opening 255 may be elongated in the X-axis direction. The opening 255 may be rectangular. In one or more embodiments, at least one slit 245 is positioned in the +X direction with respect to the opening 255 and at least one different slit 245 is positioned in the −X direction with respect to the opening 255. For example, the slits 245-1 and 245-3 may be positioned in the +X direction with respect to the opening 255, while the slits 245-2 and 245-4 may be positioned in the −X direction with respect to the opening 255.

In one or more embodiments, the distance between one of the slits 245 and the center 928 of the connection pad 240 may be equal to the distance between another of the slits 245 and the center 928. For example, the distance L225 between the closed end 245-1b of the slit 245-1 and the center 928 of the connection pad 240 in the X-axis direction may be equal to the distance L226 between the closed end 245-2b of the slit 245-2 and the center 928 in the X-axis direction. The distance L225 between the closed end of the slit 245-3 and the center 928 in the X-axis direction may be equal to the distance L226 between the closed end of the slit 245-4 and the center 928 in the X-axis direction. In other embodiments, the distance between one of the slits 245 and the center 928 of the connection pad 240 may be less than or equal to the distance between another of the slits 245 and the center 928.

Figure 7:
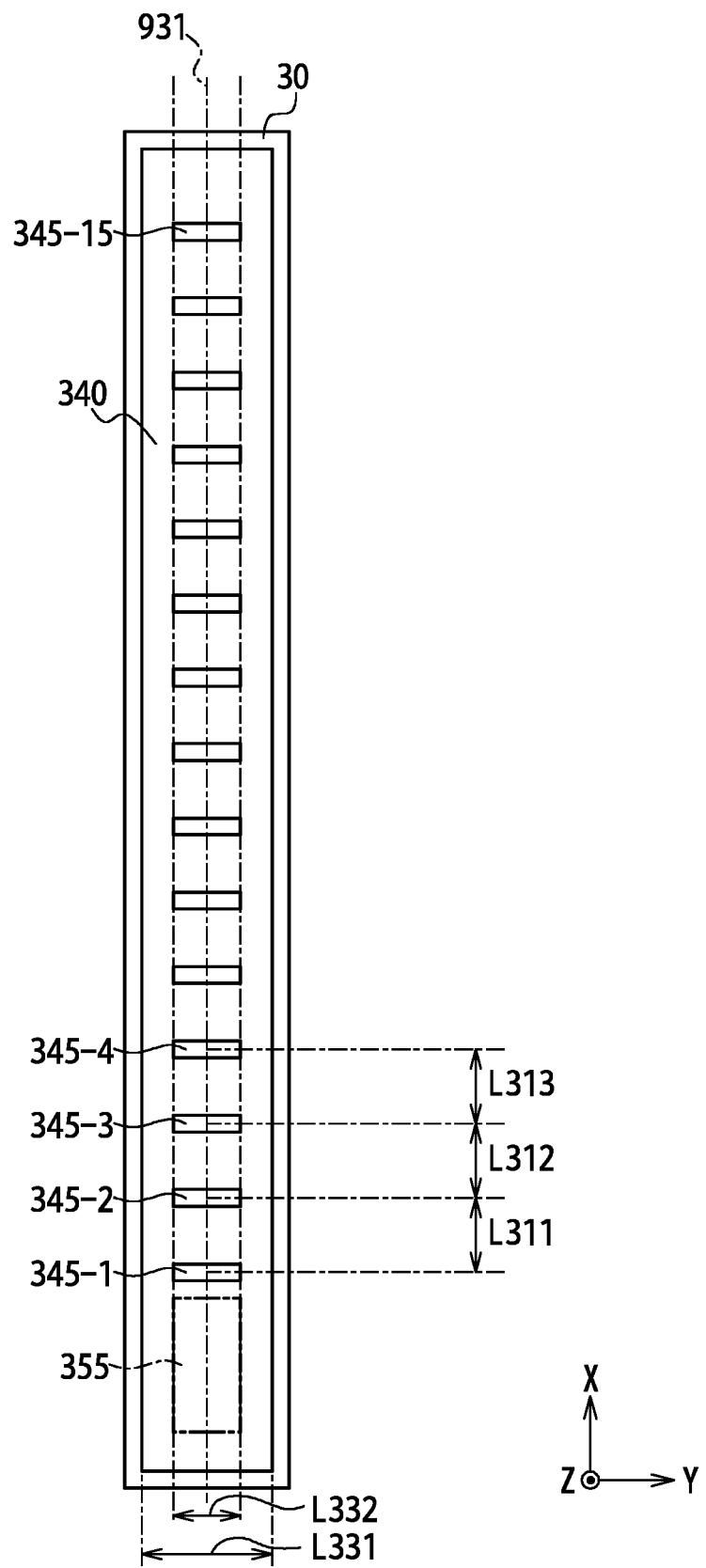
FIG. 7 is a plan view illustrating an example configuration of an external connection terminal, according to one or more embodiments.

In one or more embodiments, as illustrated in FIG. 7, a connection pad 340 may have a plurality of slits 345 each extended in the Y-axis direction. In FIG. 7, the connection pad 340 is illustrated as having fifteen slits 345-1 to 345-15. In other embodiments, the connection pad 350 may have more than fifteen slits or less than fifteen slits. The plurality of slits 345 may be arrayed in one or more columns in the X-axis direction. The geometric centers of the slits 345 may be positioned on a straight line 931 extending in the X-axis direction. The straight line 931 may pass through the geometric center of the connection pad 340. Alternatively, one or more slits 345 may have a geometric center unaligned with the straight line 931. The straight line 931 may be a center line of the connection pad 340 defined in the X-axis direction. Alternatively, the straight line 931 may differ from the center line of the connection pad 340 defined in the X-axis direction.

In one or more embodiments, all the slits 345 may be positioned in the +X direction with respect to an opening 355 through which the bump 30 is connected to the connection pad 340. In other embodiments, all the slits 345 may be positioned in the −X direction with respect to the opening 355.

In one or more embodiments, at least three slits 345 are spaced at equal intervals in the X-axis direction. For example, the distance L311 between the geometric centers of the slits 345-1 and 345-2 may be equal to the distance L312 between the geometric centers of the slits 345-2 and 345-3, and the distance L312 may be equal to the distance L313 between the geometric centers of the slits 345-3 and 345-4. In some embodiments, all the slits 345 are spaced at equal intervals. Alternatively, the distance between a first two of the slits 345 may differ from the distance between a second two of the slits 345.

In one or more embodiments, the lengths of the slits 345 may be based on the width of the connection pad 340 in the Y-axis direction. The lengths L332 of the slits 345 may be longer than about one-third of the width L331 of the connection pad 340 in the Y-axis direction. The lengths of the slits 345 may be equal to one another. Alternatively, the length of one of the slits 345 may be less than or equal to the length of another one of the slits 345.

Figure 8:
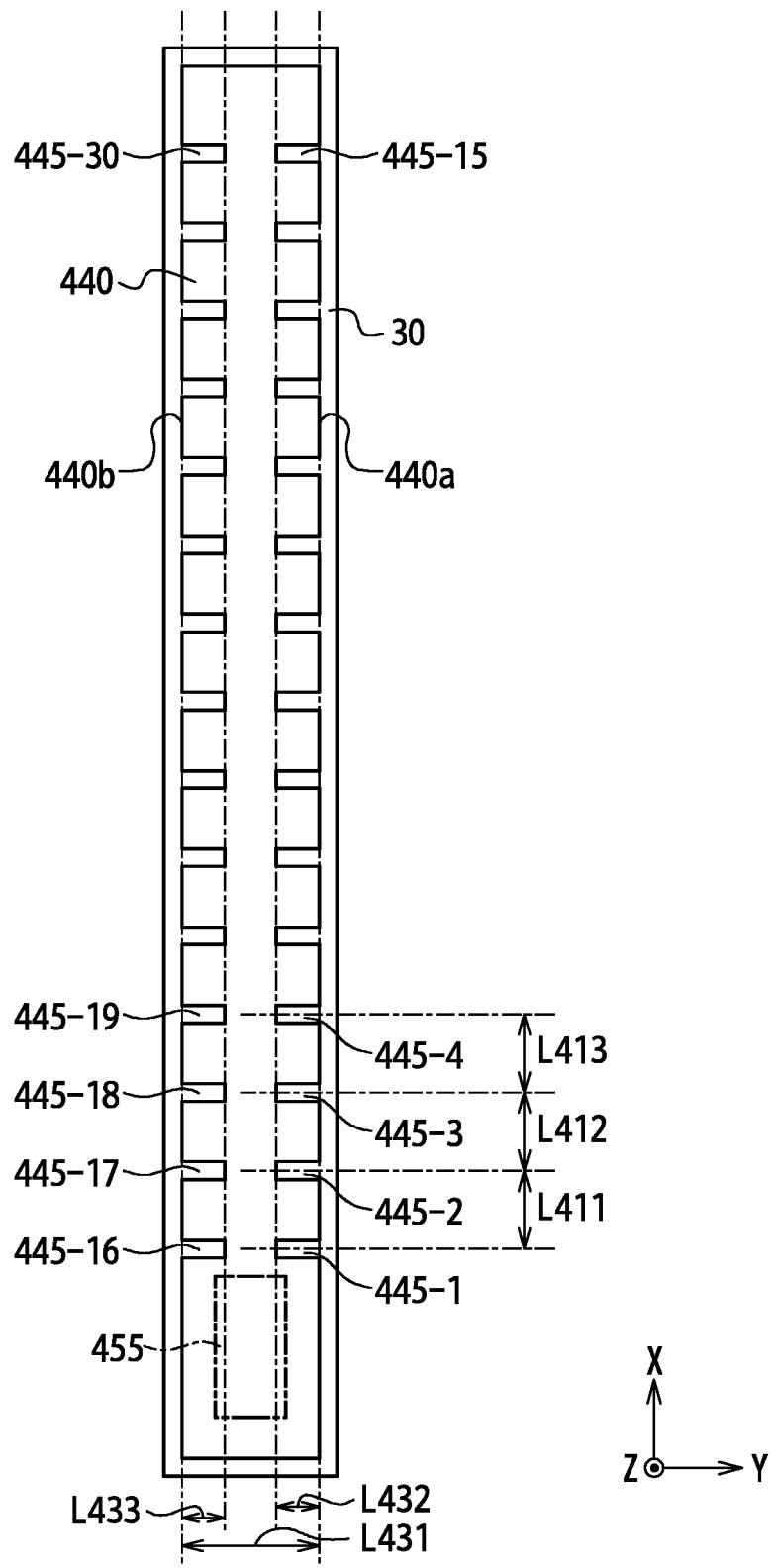
FIG. 8 is a plan view illustrating an example configuration of an external connection terminal, according to one or more embodiments.

In one or more embodiments, as illustrated in FIG. 8, a connection pad 440 has a plurality of slits 445 extended in the Y-axis direction. In FIG. 8, the connection pad 440 is illustrated as having thirty slits 445-1 to 445-30. The slits 445 may be arrayed in the X-axis direction in one or more columns.

In one or more embodiments, one end of each slit 445 is aligned on a vertical edge of the connection pad 440. In FIG. 8, the vertical edge is illustrated as being extended in the X-axis direction, which is the longitudinal direction of the connection pad 440. In some embodiments, the ends of the slits 445-1 to 445-15 in the +Y direction are aligned on a vertical edge 440a of the connection pad 440, and the ends of the slits 445-16 to 445-30 in the −Y direction are aligned on another vertical edge 440b of the connection pad 440.

In one or more embodiments, all the slits 445 are positioned in the +X direction with respect to an opening 455 through which the bump 30 is connected to the connection pad 440. Alternatively, one or more of the slits 445 is positioned in the −X direction with respect to the opening 455 and one or more of the slits 445 is positioned in the +X direction with respect to the opening 455.

In some embodiments, at least three slits 445 are spaced at equal intervals in the X-axis direction. For example, the distance L411 between the geometric centers of the slits 445-1 and 445-2 may be equal to the distance L412 between the geometric centers of the slits 445-2 and 445-3, and the distance L412 may be equal to the distance L413 between the geometric centers of the slits 445-3 and 445-4. In some embodiments, all the slits 445 are spaced at equal intervals.

In one or more embodiments, the lengths L432 and L433 of the slits 445 may be based on the width L431 of the connection pad 40 in the Y-axis direction. The lengths L432 and L433 of the slits 445 may be longer than about one-sixth of the width L431 of the connection pad 440 in the Y-axis direction.

Figure 9:
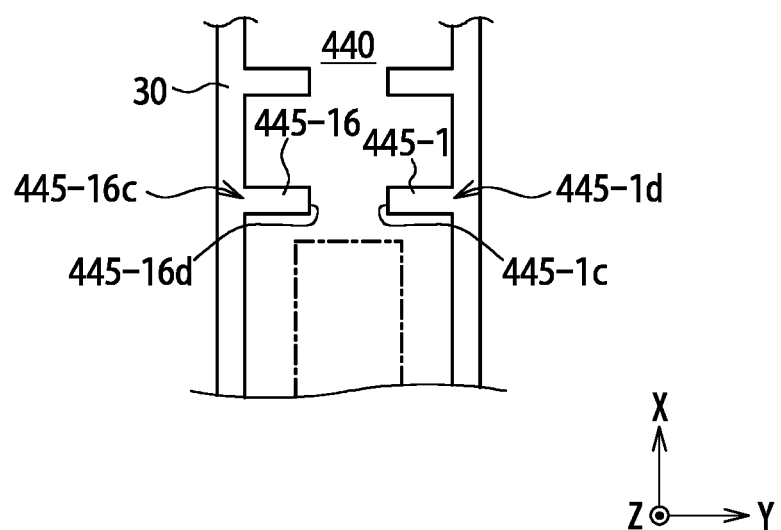
FIG. 9 is a partial plan view illustrating an example configuration of an external connection terminal, according to one or more embodiments.

In one or more embodiments, at least one of the slits 445 has an open end and a closed end. For example, as illustrated in FIG. 9, the slit 445-1 may have a closed end 445-1c in the −Y direction and an open end 445-1d in the +Y direction, and the slit 445-16 may have an open end 445-16c in the −Y direction and a closed end 445-16d in the +Y direction. In FIG. 8, the slits 445-1 to 445-15 are illustrated as each having an open end in the +Y direction and a closed end in the −Y direction, while the slits 445-16 to 445-30 are illustrated as each having an open end in the −Y direction and a closed end in the +Y direction.

Figure 10:
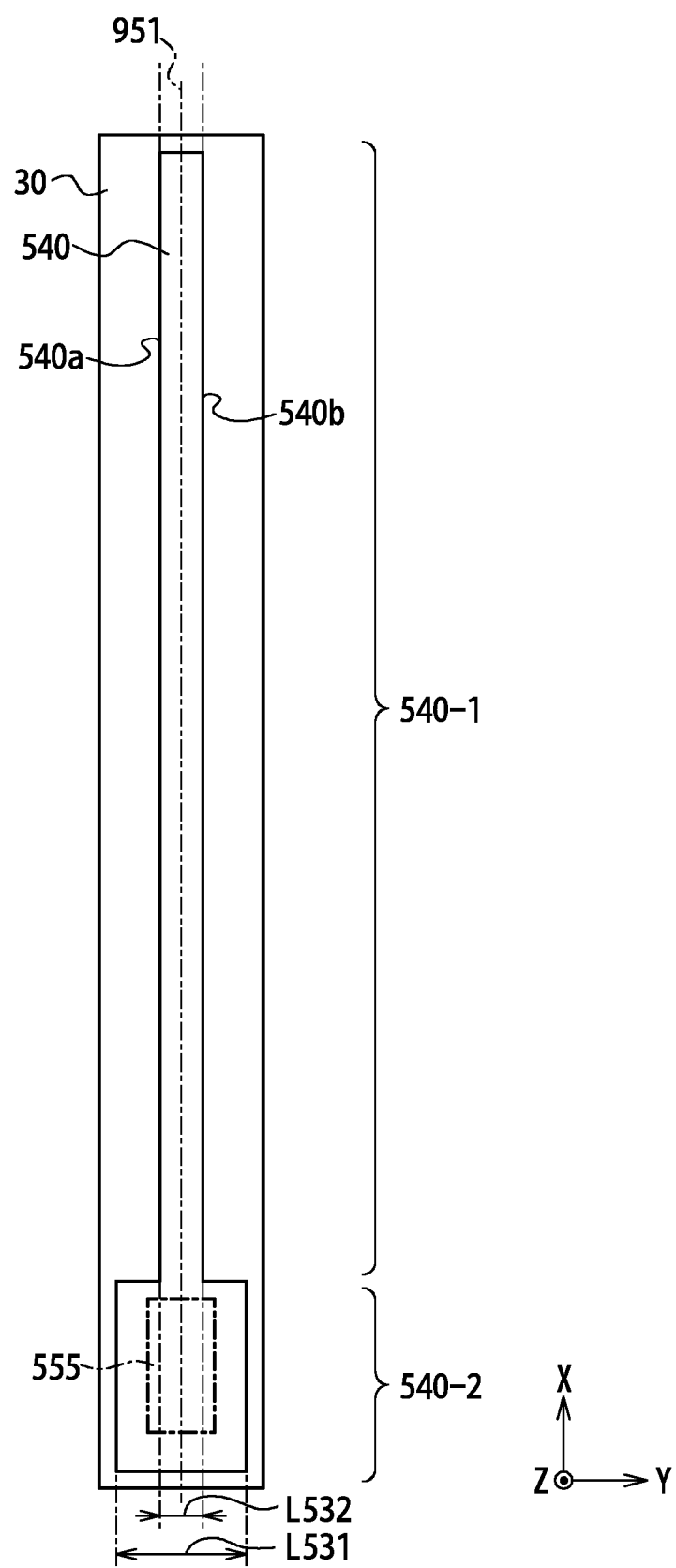
FIG. 10 is a plan view illustrating an example configuration of an external connection terminal, according to one or more embodiments.

In one or more embodiments, as illustrated in FIG. 10, a connection pad 540 comprises a narrow portion 540-1 and a wide portion 540-2. In some embodiments, an opening 555 through which the bump 30 is connected to the connection pad 540 is positioned at the wide portion 540-2. In one or more embodiments, the narrow portion 540-1 is extended from the wide portion 540-2 in the X-axis direction. The narrow portion 540-1 may be positioned in the +X or −X direction with respect to the opening 555.

In one or more embodiments, the width L532 of the narrow portion 540-1 is narrower than the width L531 of the wide portion 540-2. Such structure may reduce an influence of an internal stress generated in the connection pad 540, suppressing or avoiding peeling of the bump 30 and/or the connection pad 540. The width L532 of the narrow portion 540-1 may be in the range from about one-third to about two-thirds of the width L531 of the wide portion 540-2.

The narrow portion 540-1 may be extended along a center line 951 of the connection pad 540. The center line 951 may be defined in the X-axis direction. The narrow portion 540-1 may be formed in a line-symmetric manner with respect to the center line 951.

Figure 11:
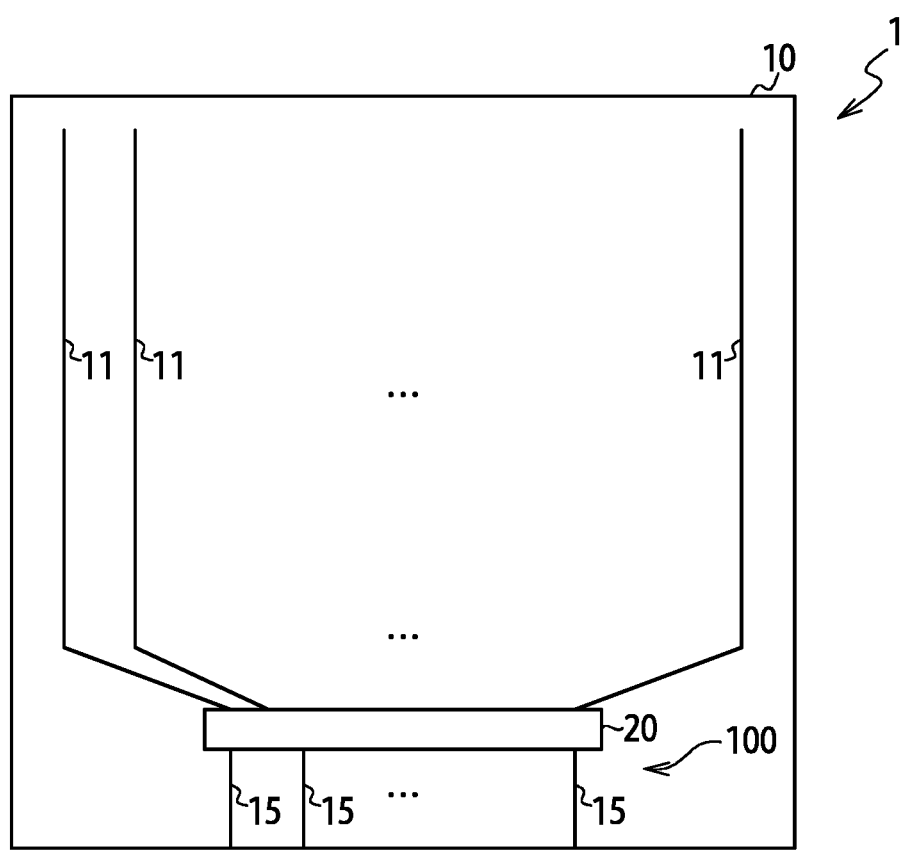
FIG. 11 illustrates an example configuration of a display device, according to one or more embodiments.

In one or more embodiments, as illustrated in FIG. 11, a display device 1 comprises a display panel 10 and a processing system 100 configured to drive the display panel 10. The display device 1 may be used as a user interface for an automotive application or a cell phone application.

In various embodiments, the processing system 100 comprises a semiconductor device 20 configured as described above. In one or more embodiments, the bumps 30 of the external connection terminals 25 of the semiconductor device 20 are bonded on the display panel 10 with an anisotropic conductive film (ACF) through a COG technology.

In some embodiments, the display panel 10 may comprise interconnection lines 11 and external connection lines 15. The interconnection lines 11 may be connected to internal elements, such as pixel circuits. The external connection lines 15 may be configured to be connected to an external device. The interconnection lines 11 and the external connection lines 15 may be connected to the external connection terminals 25 of the semiconductor device 20. The interconnection lines 11 may be configured to transmit signals to the pixel circuits from the semiconductor device 20. The display panel 10 may comprise one or more sensor electrodes used for capacitive sensing to sense input provided by one or more input objects. In such embodiments, one or more of the interconnection lines 11 may be connected to the sensor electrodes. The external connection lines 15 may be configured to transmit signals from an external device to the semiconductor device 20.

While various embodiments have been specifically described herein, a person skilled in the art would appreciate that the technologies disclosed herein may be implemented with various modifications.

What is claimed is:

1. A semiconductor device comprising:
   a semiconductor substrate;
   a bump; and
   a connection pad connected to the bump and disposed between the semiconductor substrate and the bump, the connection pad having one or more slits,
   wherein the one or more slits comprise a plurality of first slits arrayed in a longitudinal direction of the connection pad and wherein each of the plurality of first slits has first geometric centers positioned on a first straight line extending in the longitudinal direction.

2. The semiconductor device according to claim 1, wherein the connection pad is elongated in a longitudinal direction, and
   wherein the one or more slits are extended in a first direction orthogonal to the longitudinal direction of the connection pad.

3. The semiconductor device according to claim 1, wherein the one or more slits are extended in a longitudinal direction of the connection pad.

4. The semiconductor device according to claim 1, wherein the plurality of first slits are extended in a first direction orthogonal to the longitudinal direction of the connection pad.

5. The semiconductor device according to claim 1, wherein lengths of the plurality of first slits are longer than one-third of a width of the connection pad in the first direction.

6. The semiconductor device according to claim 1, wherein the first straight line comprises a center line of the connection pad.

7. The semiconductor device according to claim 1, wherein the one or more slits further comprises a plurality of second slits arrayed in the longitudinal direction of the connection pad, and
   wherein each of the plurality of second slits has second geometric centers aligned on a second straight line extending in the longitudinal direction, the second straight line being different from the first straight line.

8. The semiconductor device according to claim 7, wherein the plurality of first slits and the plurality of second slits are extended in a first direction orthogonal to the longitudinal direction of the connection pad.

9. The semiconductor device according to claim 8, wherein lengths of the plurality of first slits and lengths the plurality of second slits are longer than one sixth of a width of the connection pad in the first direction.

10. The semiconductor device according to claim 7, wherein the plurality of first slits and the plurality of second slits are extended in the longitudinal direction of the connection pad.

11. The semiconductor device according to claim 1, wherein the one or more slits comprises a plurality of slits spaced at equal intervals.

12. The semiconductor device according to claim 11, further comprising a passivation layer comprising an opening through which the bump is connected to the connection pad,
   wherein the plurality of slits are positioned in a second direction with respect to the opening, the second direction being parallel to a longitudinal direction of the connection pad.

13. The semiconductor device according to claim 1, wherein the one or more slits have an open end and a closed end.

14. A semiconductor device comprising:
   a semiconductor substrate;
   a bump; and
   a connection pad connected to the bump and disposed between the semiconductor substrate and the bump, the connection pad having one or more slits;
   a passivation layer comprising an opening through which the bump is connected to the connection pad,
   wherein the one or more slits comprises:
   a first slit positioned in a second direction parallel to a longitudinal direction of the connection pad with respect to the opening; and
   a second slit positioned in a third direction opposite to the second direction with respect to the opening.

15. A semiconductor device comprising:
   a semiconductor substrate;
   a bump; and
   a connection pad connected to the bump and disposed between the semiconductor substrate and the bump, the connection pad having one or more slits, wherein the one or more slits comprises a first slit and a second slit extended in a first direction orthogonal to a longitudinal direction of the connection pad, wherein the first slit has a first open end in the first direction and a first closed end in a second direction opposite to the first direction, and wherein the second slit has a second open end in the second direction and a second closed end in the first direction.

16. A method comprising:

preparing a semiconductor substrate;

forming a connection pad comprising one or more slits over the semiconductor substrate, wherein the one or more slits comprise a plurality of first slits arrayed in a longitudinal direction of the connection pad and wherein each of the plurality of first slits has first geometric centers positioned on a first straight line extending in the longitudinal direction; and forming a bump over the connection pad, wherein the bump is connected to the connection pad.

17. The method according to claim 16, wherein the connection pad is elongated in a longitudinal direction, and wherein the one or more slits are extended in a first direction orthogonal to the longitudinal direction of the connection pad.

18. A semiconductor device comprising:

a semiconductor substrate;

a bump; and a connection pad connected to the bump and disposed between the semiconductor substrate and the bump, the connection pad having one or more slits, wherein the connection pad comprises a narrow portion and a wide portion, and wherein one or more of the one or more slits is positioned in the wide portion.

19. The semiconductor device according to claim 18, wherein the narrow portion is extended from the wide portion along a center line of the connection pad.

* * * * *